(12) United States Patent
Otto et al.

(10) Patent No.: US 11,195,981 B2
(45) Date of Patent: Dec. 7, 2021

(54) METHOD OF PRODUCING A RADIATION-EMITTING SEMICONDUCTOR COMPONENT, AND RADIATION-EMITTING SEMICONDUCTOR COMPONENT

(71) Applicant: OSRAM Opto Semiconductors GmbH, Regensburg (DE)

(72) Inventors: Isabel Otto, Regenstauf (DE); Anna Kasprzak-Zablocka, Donaustauf (DE); Christian Leirer, Friedberg (DE)

(73) Assignee: OSRAM OLED GmbH, Regensburg (DE)

( * ) Notice: Subject to any disclaimer, the term of this patent is extended or adjusted under 35 U.S.C. 154(b) by 80 days.

(21) Appl. No.: 16/607,226

(22) PCT Filed: May 8, 2018

(86) PCT No.: PCT/EP2018/061925
§ 371 (c)(1),
(2) Date: Oct. 22, 2019

(87) PCT Pub. No.: WO2018/206604
PCT Pub. Date: Nov. 15, 2018

(65) Prior Publication Data
US 2020/0388734 A1 Dec. 10, 2020

(30) Foreign Application Priority Data
May 10, 2017 (DE) .......................... 102017110073.3

(51) Int. Cl.
*H01L 33/62* (2010.01)
*H01L 33/08* (2010.01)
(Continued)

(52) U.S. Cl.
CPC .............. *H01L 33/62* (2013.01); *H01L 33/08* (2013.01); *H01L 33/38* (2013.01); *H01L 33/486* (2013.01)

(58) Field of Classification Search
CPC ....................................................... H01L 33/62
See application file for complete search history.

(56) References Cited

U.S. PATENT DOCUMENTS 9,590,151 B2  3/2017  Richter et al.
2012/0248405 A1  10/2012  Tu et al.
(Continued)

FOREIGN PATENT DOCUMENTS

DE  10 2015 114 579  12/2013
DE  10 2014 117 435  6/2016
(Continued)

*Primary Examiner* — Stephen M Bradley
(74) *Attorney, Agent, or Firm* — DLA Piper LLP (US)

(57) ABSTRACT

A method of manufacturing semiconductor device includes providing a radiation emitting semiconductor chip having a first main surface, applying a metallic seed layer to a second main surface opposite the first main surface, galvanically depositing first and second metallic volume regions on the seed layer, depositing an adhesion promoting layer on the volume regions, and applying a casting compound at least between contact points, wherein before the metallic volume regions are galvanically deposited, a dielectric layer is first applied to the seed layer over its entire surface and openings are produced in the dielectric layer by etching, and a material of the metallic volume regions is deposited through the openings of the dielectric layer, wherein the dielectric layer is underetched at boundaries to the openings and the underetches are filled with material of the metallic volume regions during the galvanical depositing of the metallic volume regions.

13 Claims, 4 Drawing Sheets

(51) Int. Cl.
*H01L 33/38* (2010.01)
*H01L 33/48* (2010.01)

(56) References Cited

U.S. PATENT DOCUMENTS

| | | | |
|---|---|---|---|
| 2013/0093100 A1* | 4/2013 | Shariff | H01L 24/06 |
| | | | 257/774 |
| 2013/0221509 A1 | 8/2013 | Oda et al. | |
| 2013/0248910 A1 | 9/2013 | Kimura et al. | |
| 2016/0035948 A1 | 2/2016 | Happoya et al. | |
| 2017/0077052 A1* | 3/2017 | Mariottini | H01L 24/11 |
| 2018/0166618 A1* | 6/2018 | Kim | H01L 24/11 |

FOREIGN PATENT DOCUMENTS

| | | |
|---|---|---|
| DE | 10 2015 114 583 | 3/2017 |
| EP | 2 669 962 | 12/2013 |
| WO | 2014/170271 | 10/2014 |

* cited by examiner

METHOD OF PRODUCING A RADIATION-EMITTING SEMICONDUCTOR COMPONENT, AND RADIATION-EMITTING SEMICONDUCTOR COMPONENT

TECHNICAL FIELD

This disclosure relates to a method of manufacturing a radiation emitting semiconductor device and a radiation emitting semiconductor device.

BACKGROUND

A method of manufacturing radiation emitting semiconductor devices and radiation emitting semiconductor devices is described, for example, in DE 102015114583. There is nonetheless a need for a radiation emitting semiconductor device with increased fracture stability and a method of manufacturing such a radiation emitting semiconductor device.

SUMMARY

We provide a method of manufacturing a radiation emitting semiconductor device including providing a radiation emitting semiconductor chip having a first main surface including a radiation exit surface of the semiconductor chip, applying a metallic seed layer to a second main surface of the semiconductor chip opposite the first main surface, galvanically depositing a metallic volume region of a first electrical contact point and a metallic volume region of a second electrical contact point on the seed layer, depositing an adhesion promoting layer on the volume regions of the first electrical contact point and the second electrical contact point, and applying a casting compound at least between the contact points, wherein before the metallic volume regions are galvanically deposited, a dielectric layer is first applied to the seed layer over its entire surface and openings are produced in the dielectric layer by etching, and a material of the metallic volume regions is deposited through the openings of the dielectric layer, wherein the dielectric layer is underetched at boundaries to the openings and the underetches are filled with material of the metallic volume regions during the galvanical depositing of the metallic volume regions.

Figure 1:
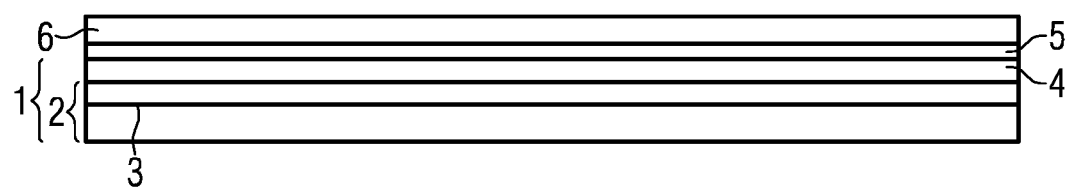
FIGS. 1 to 6 are schematic sectional views of a method according to an example.

REFERENCE SIGN LIST 1 semiconductor chip
2 epitaxial semiconductor layer sequence
3 radiation generating active zone
4 Semiconductor structure
5 seed layer
6 dielectric layer
7 structural element of a photoresist
8 openings
9 underetchings
10 metallic volume region
11 base point
12 adhesion promoting layer
13 casting compound
14 electrical contact point
15 solderable layer

DETAILED DESCRIPTION

According to our method of manufacturing the radiation emitting semiconductor device, at least one radiation emitting semiconductor chip with a first main surface comprising a radiation exit surface of the semiconductor chip may be provided. The semiconductor chip may further comprise an epitaxial semiconductor layer sequence with an active zone suitable to generate electromagnetic radiation. The electromagnetic radiation generated in the active zone of the epitaxial semiconductor layer sequence is emitted from the radiation exit surface of the semiconductor chip during its operation.

A metallic seed layer may be applied to a second main surface of the semiconductor chip, which is opposite the first main surface. The seed layer can, for example, comprise of one of the following materials or can consist of one of the following materials: Au, Ti, Cu, Al, Ag, Sn, Rh, Pt.

The seed layer can be deposited by one of the following methods: electroless galvanic deposition, evaporation, PECVD (Plasma Enhanced Chemical Vapor Deposition), sputtering.

The seed layer, for example, has a thickness of 20 nanometers to 5 micrometers. Particularly preferably, the seed layer has a value of 100 nanometers to 300 nanometers. For example, the thickness of the seed layer has a value of approximately 200 nanometers.

The seed layer can also be assembled as a layer sequence of individual layers. For example, the seed layer can be formed of a titanium layer and a gold layer or a titanium layer and a copper layer.

A metallic volume region of a first electrical contact point and a metallic volume region of a second electrical contact point may be galvanically deposited on the seed layer. Preferably, the deposition of the first volume region and the second volume region takes place simultaneously. The term "galvanic deposition" refers to galvanic deposition under current flow, while the term "electroless galvanic deposition" refers to galvanic deposition without current flow. Electroless galvanic deposition is usually a precipitation reaction of metal ions from liquid onto a surface to be coated. Galvanic deposition is the deposition of metal ions on a surface to be coated from a liquid electrolyte by applying an external voltage, whereby an electric current forms in the liquid electrolyte.

For example, the metallic volume region of the first electrical contact point and the metallic volume region of the second electrical contact point have one of the following materials: Nickel, copper, tin, gold. Particularly preferably, the metallic volume region of the first electrical contact point and the metallic volume region of the second electrical contact point have the same material. For example, the metallic volume regions of the first electrical contact point and the second electrical contact point have a thickness of 5 micrometers to 300 micrometers. Preferably, the metallic volume regions of the first electrical contact point and the second electrical contact point have a thickness of 50 micrometers to 200 micrometers. A typical thickness of the volume regions is approximately 150 micrometers. Particularly preferably, the volume region of the first electrical contact point and the volume region of the second electrical contact point have the same thickness.

An adhesion promoting layer may be deposited on the volume region of the first electrical contact point and on the volume region of the second electrical contact point. Particularly preferably, the adhesion promoting layer covers the volume regions completely at first.

For example, the adhesion promoting layer comprises one of the following materials or is formed of one of the following materials: SiN, $SiO_x$, Ti, $TiO_2$, Sn, fluorinated compounds. Preferably, the adhesion promoting layer comprises tin or is formed of tin, if the volume region comprises nickel or is formed of nickel. Furthermore, an adhesion promoting layer comprising SiN or consisting of SiN is particularly well used in combination with a volume region comprising copper or consisting of copper, because SiN adheres well to copper.

The adhesion promoting layer can, for example, be applied by one of the following methods: galvanic deposition, PVD (Physical Vapor Deposition), CVD (Chemical Vapor Deposition), sputtering, electroless galvanic deposition, spinning, dipping, spraying.

The adhesion promoting layer may have a thickness of 0.5 nanometers to 5 micrometers. Particularly preferably, the adhesion promoting layer has a thickness of 5 nanometers to 300 nanometers.

A casting compound may be applied at least between the contact points. The casting compound is preferably applied such that the region between the contact points is completely filled by the casting compound. At first, the casting compound may completely envelop the contact points preferably and forms a closed layer over the contact points with a flat surface. For example, the casting compound comprises one of the following materials or consists of one of the following materials: epoxies, silicates, silicones. The casting compound can be filled with particles. In particular, an epoxy can be filled with particles.

The casting compound may be partially removed in a next step so that the first main surfaces of the contact points may be freely accessible from the outside. The first main surfaces of the contact points are turned away from the semiconductor chips. The removal of the casting compound is carried out, for example, by grinding. The contact points and the casting compound are preferably flush with each other after removal of the casting compound and form a flat surface. Usually, the adhesion promoting layer is at least partially removed from the first main surfaces of the electrical contact points when the casting compound is removed, while the side surfaces of the electrical contact points remain preferably completely covered with the adhesion promoting layer. The adhesion promoting layer can also be completely removed from the first main surfaces of the contact points when the casting compound is removed.

A solderable layer may be applied to the first main surfaces of the contact points, which are freely accessible after removal of the casting compound. In particular, if the volume region contains nickel or consists of nickel, it is advantageous to apply the solderable layer to the first main surfaces of the contact points to be able to fasten the finished semiconductor device to a connection carrier by soldering.

For example, the solderable layer can consist of one of the following materials: Gold, copper, AuSn alloys, NiSn alloys.

For example, the solderable layer can comprise one of the following materials or can consist of one of the following materials: Gold, copper, AuSn alloys, NiSn alloys.

For example, the solderable layer has a thickness of 20 nanometers to 20 micrometers. Preferably, the solderable layer has a thickness of 100 nanometers to 5 micrometers.

Between the solderable layer and the volume region a further layer can be arranged, which serves for adhesion promotion between the volume region and the solderable layer. The further layer can comprises nickel or can consist of nickel, for example.

The adhesion promoting layer may be at first be applied to the volume regions such that it completely covers the surface of the volume regions. Then, the casting compound is applied such that the casting compound completely envelops the electrical contact points and, in a next step, the first main surfaces of the electrical contact points are exposed by removing the casting compound, whereby the adhesion promoting layer is removed from the first main surfaces of the electrical contact points, for example, completely.

A structured dielectric layer with openings may be applied to the seed layer before the metal volume regions are galvanically deposited. Then, the material of the metallic volume regions may be deposited through the openings of the dielectric layer. The dielectric layer remains preferably free of the material of the metallic volume regions. For example, the dielectric layer comprises one of the following materials or consists of one of the following materials: SiN, $SiO_2$, $TiO_2$, $Al_2O_3$. Furthermore, it is also possible that the dielectric layer is formed from a layer sequence with different individual layers, whereby the individual layers comprise one of the mentioned materials or are formed from one of the materials.

For example, the dielectric layer has a thickness of 20 nanometers to 10 micrometers. Preferably, the dielectric layer has a thickness of 100 nanometers to 1 micrometer. Typically, the dielectric layer has a thickness of about 500 nanometers.

Particularly preferably, the dielectric layer is at first applied over the entire surface of the seed layer and the openings in the dielectric layer are then created by etching.

When etching the openings, the dielectric layer can be underetched at the boundaries of the openings. For example, an isotropic etching method such as a wet chemical etching method is suitable to generate underetchings. If the metallic material of the volume regions is then galvanically deposited on the seed layer exposed in the openings, the underetchings are filled with the material of the volume regions. In such a way, electrical contact points can be created, whose second main surfaces are enlarged compared to the first main surfaces. In such a way, widened base points of the contact points can be created for better anchoring of the contact points in the casting compound.

Structural elements of a photoresist may be applied to the dielectric layer formed over its entire surface and the openings in the dielectric layer may be created by etching the regions that are freely accessible. It is also possible to apply an adhesion layer to the dielectric layer before the photoresist is applied, which improves adhesion to the photoresist.

The adhesion layer, for example, can comprise a metal or can be formed from a metal. For example, the adhesion layer comprises one of the following materials or is formed from one of the following materials: Titanium, zinc oxide, gold. Usually, the adhesion layer is removed before the semiconductor device is completed, for example, after the photoresist has been removed because the adhesion layer can promote formation of short circuits. Preferably, the adhesion layer is relatively thin.

Preferably, the metallic volume regions are deposited between the structural elements of the photoresist. The structural elements are preferably directly adjacent to the metallic volume regions. In this way, straight side surfaces of the metallic volume regions can be formed.

Particularly preferably, the method is carried out in a wafer compound. Herein, several semiconductor chips are with advantage provided at the same time, which are comprised by a common wafer. These semiconductor chips are then simultaneously processed according to the described method steps. In such a way, several radiation emitting semiconductor devices are be produced in parallel with advantage.

The method is particularly suitable for producing a radiation emitting semiconductor device. All features described herein in connection with the method can therefore also be applied to the radiation emitting semiconductor device and vice versa.

The radiation emitting semiconductor device may have a radiation emitting semiconductor chip comprising a first main surface comprising a radiation exit surface of the semiconductor chip.

Furthermore, the semiconductor chip comprises a first electrical contact point and a second electrical contact point disposed on a second main surface of the semiconductor chip opposite the first main surface.

Each contact point preferably has a metallic volume region and an adhesion promoting layer, wherein the adhesion promoting layer at least partially forms an outer surface of the contact point and effects an adhesion promotion to a casting compound laterally enveloping the contact points. The casting compound is intended to mechanically stabilize the semiconductor device. Preferably, the casting compound stabilizes the semiconductor device such that a prefabricated housing is no longer necessary for stabilization. The semiconductor device is preferably free of a prefabricated housing.

The adhesion promoting layer may completely cover side surfaces of the volume regions of the contact points, while a main surface of the volume regions may be free of the adhesion promoting layer. Preferably, a solderable layer is applied to the main surface of the volume regions, enabling the semiconductor device to be mounted on a connection carrier. The solderable layer preferably forms a mounting surface of the contact points.

A second main surface of each contact point facing the semiconductor chip may have a larger area than a first main surface of each contact point lying opposite the second main surface. In other words, the contact points have widened base points that can lead to improved anchoring of the contact points.

The method and the semiconductor device form an adhesion promoting layer as the outermost layer of the contact points of the radiation emitting semiconductor device, wherein the adhesion promoting layer improves the adhesion to a directly adjacent casting compound. In particular, in comparatively thick contact points, the improvement of the adhesion between the contact points and the casting compound leads to a semiconductor device with increased mechanical fracture stability. Furthermore, materials such as copper, nickel, tin or gold that are particularly suitable as materials for volume regions due to their electrical properties, often exhibit poor adhesion to typical casting compounds. By applying a (thin) adhesion promoting layer to the volume regions, the electrical properties of the contact points are determined predominantly by the material of the volume regions, while adhesion to the casting compound enveloping the contact points is determined by the material of the adhesion promoting layer.

Further advantages and developments of the method and the semiconductor device result from the examples described in the following in connection with the Figures.

Equal or similar elements as well as elements of equal function are designated with the same reference signs in the Figures. The Figures and the proportions of the elements shown in the Figures are not regarded as being shown to scale. Rather, single elements, in particular layers, can be shown exaggerated in magnitude for the sake of better presentation and/or better understanding.

In the method according to the example of FIGS. 1 to 6, a semiconductor chip 1 having an epitaxial semiconductor layer sequence 2 with a radiation generating active zone 3, is first provided. The active radiation generating zone 3 is located between an n-type region of the semiconductor layer sequence 2 and a p-type region of the semiconductor layer sequence 2. A semiconductor structure 4 with electrical contacts to the n-conducting region and the p-conducting region is applied to the epitaxial semiconductor layer sequence 2.

A seed layer 5 is applied to the semiconductor chip 1, for example, by one of the methods already mentioned. The seed layer 5 completely covers the surface of the semiconductor chip 1. A dielectric layer 6 is applied to the entire surface of seed layer 5, also using one of the methods already mentioned. The resulting arrangement is shown schematically in FIG. 1. An adhesion layer (not shown) for a subsequently applied photoresist can also be arranged on the dielectric layer 6.

Figure 2:
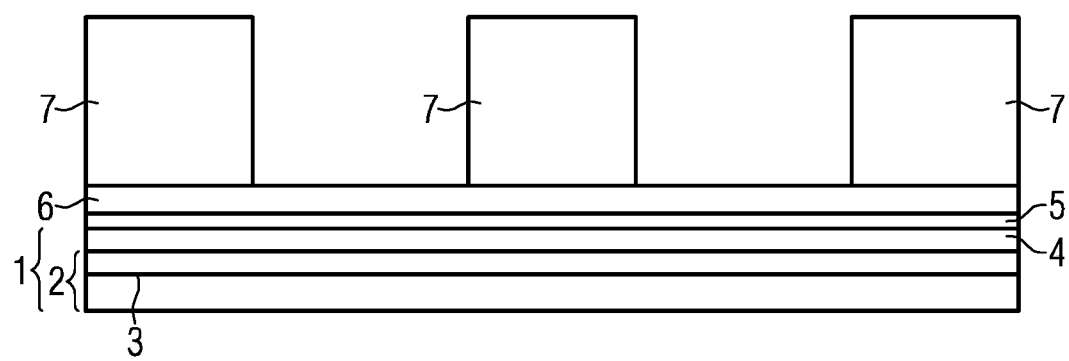

As schematically shown in FIG. 2, structural elements 7 of a photoresist are applied to the dielectric layer 6, wherein regions of the dielectric layer 6 remain freely accessible.

Figure 3:
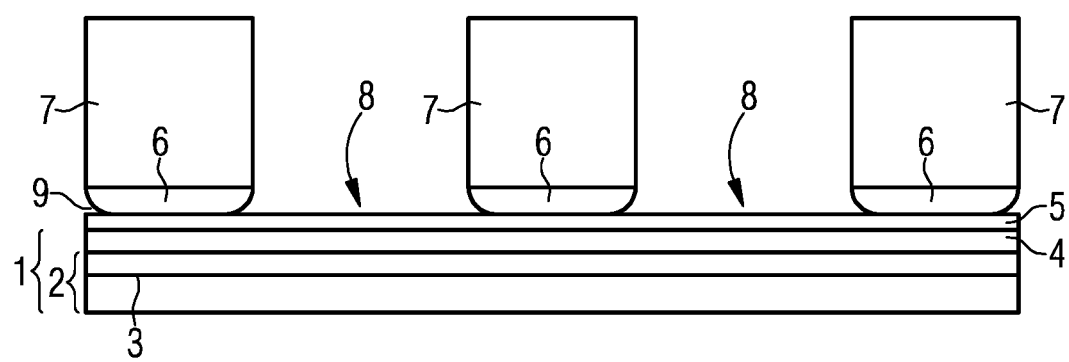

In a next step, the dielectric layer 6 is removed by etching in the regions that are freely accessible as shown in FIG. 3. In such a way, openings 8 are formed in the dielectric layer 6 in the regions not covered by the structural elements 7 of the photoresist. The dielectric layer 6 is preferably underetched starting from the boundaries of the openings 8 so that underetchings 9 arise.

Figure 4:
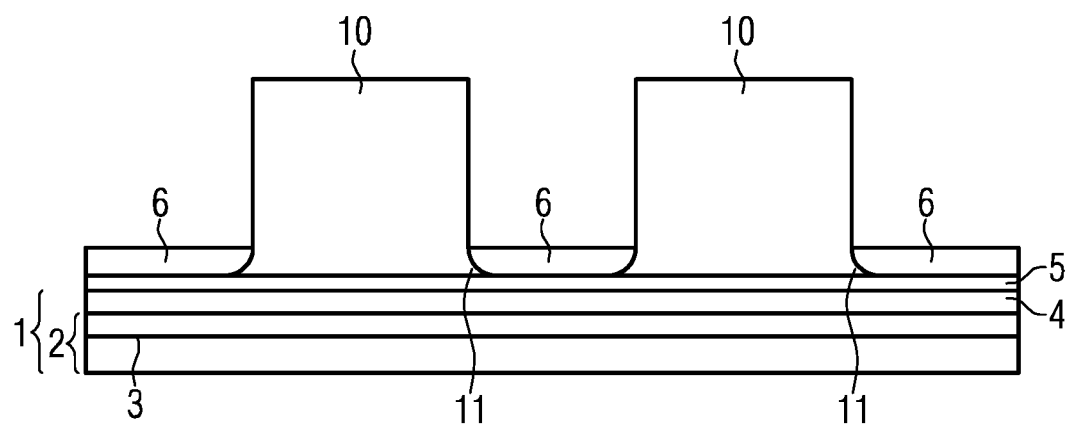

In a next step, which is schematically shown in FIG. 4, a metallic volume region 10 of a first electrical contact point and a metallic volume region 10 of a second electrical contact point are galvanically deposited in the openings 8 of the dielectric layer 6 between the structural elements 7 of the photoresist. The structural elements 7 of the photoresist form straight side surfaces of the volume regions 10. The volume regions 10 can contain nickel, copper, tin or gold, for example, or consist of one of these materials. During the galvanic deposition of the metallic volume regions 10, the underetchings 9 in the dielectric layer 6 are also filled with the metallic material of the volume regions 10 so that a widened base point 11 of the later contact points is created in each case. The structural elements 7 of the photoresist are then removed again.

Figure 5:
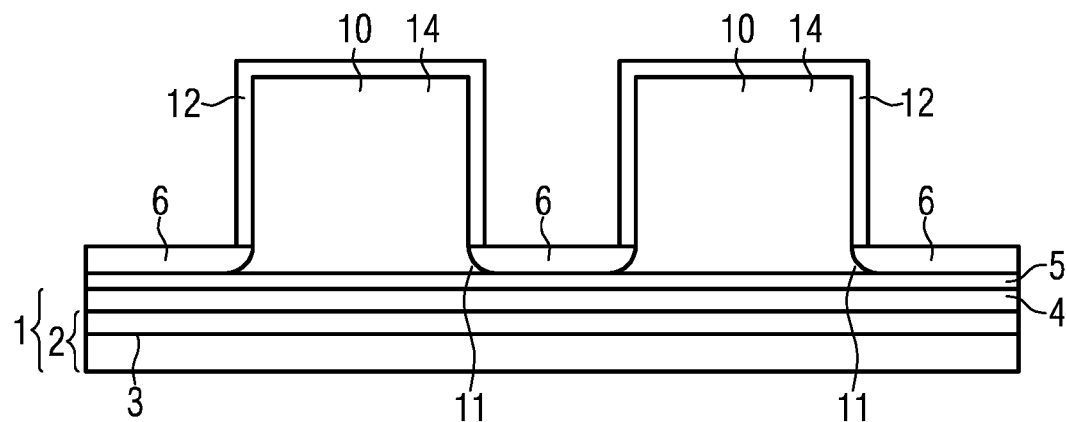

In the next step, which is schematically shown in FIG. 5, an adhesion promoting layer 12 is first applied to the surfaces of the volume regions 10 over the entire area, wherein no deposition takes place on the material of the dielectric layer 6. The volume regions 10 with the adhesion promoting layer 12 form electrical contact points 14 of the later semiconductor device.

Figure 6:
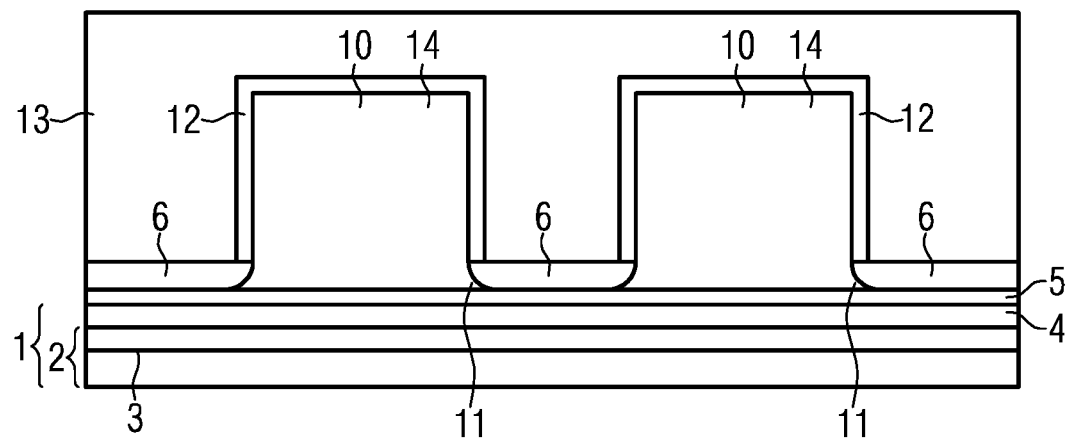

In a next step, a casting compound 13 is applied to the semiconductor chip 1 that completely fills the interspaces between the contact points 14 and also completely envelops the contact points 14 at first so that the casting compound 13 forms a layer over the contact points 14 with a flat surface as shown in FIG. 6.

In a next step, the casting compound 13 is partially removed again, for example, by grinding so that the first main surfaces of the electrical contact points 14 are exposed.

The adhesion promoting layer 12 of the first main surfaces of the contact points 14 is removed again so that the material of the metallic volume regions 10 is at first freely accessible. Then, a solderable layer 15 is applied to the first exposed main surfaces of the metallic volume regions 10.

Figure 7:
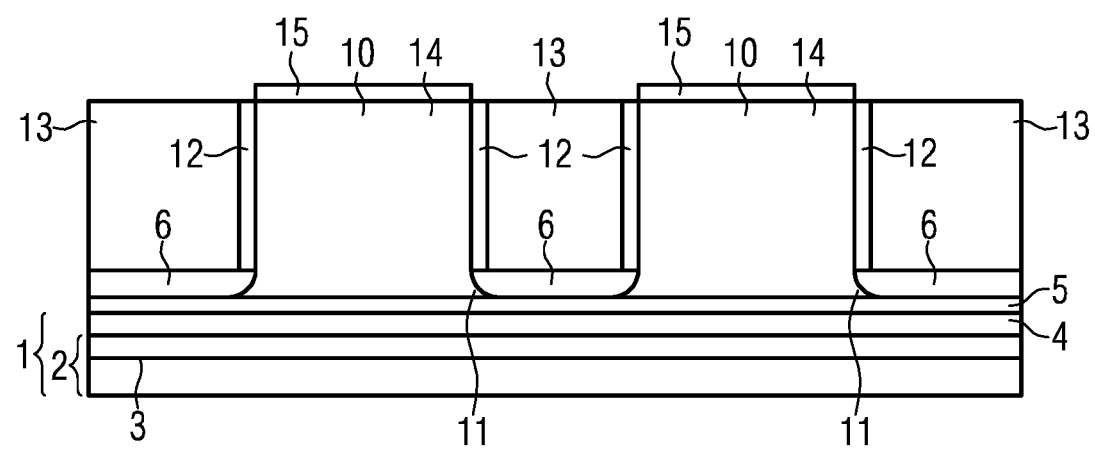
FIG. 7 shows a schematic sectional view of a radiation emitting semiconductor device according to an example

A semiconductor device, as it can be manufactured with the method according to the example of FIGS. 1 to 6, is shown schematically in FIG. 7.

The semiconductor device according to the example of FIG. 7 has an epitaxial semiconductor layer sequence 2 with an active zone 3 suitable for generating electromagnetic radiation. The active radiation generating zone 3 is located between an n-type region of the semiconductor layer sequence 2 and a p-type region of the semiconductor layer sequence 2. The electromagnetic radiation generated in the active zone is emitted from a radiation exit surface of the semiconductor chip 1, which comprises a first main surface of the semiconductor chip. The first main surface of the semiconductor chip is opposite a second main surface. A semiconductor structure 4 with electrical contacts to the n-conducting region and the p-conducting region is applied to the epitaxial semiconductor layer sequence 2. A seed layer 5 is arranged over the entire surface of the semiconductor structure 4.

Furthermore, the semiconductor device according to the example of FIG. 7 comprises two electrical contact points 14, each of which has a metallic volume region 10, the side surfaces of which are completely covered with an adhesion promoting layer 5. The adhesion promoting layer 5 is directly adjacent to a casting compound 13, which completely fills the region between the electrical contact points 14 and completely covers the electrical contact points 14 laterally, while first main surfaces of the electrical contact points 14 are free of the adhesion promoting layer 12. A dielectric layer 6 is arranged on the seed layer 5 between the electrical contact points 14 and directly adjoins the casting compound 13. A solderable layer 15 is formed on the metal volume regions, forming the first main surfaces of the electrical contact points 14.

This application claims priority of DE 102017110073.3, the subject matter of which is incorporated by reference in its entirety.

Our methods and components are not limited to the description of the examples. Rather, this disclosure comprises each new feature as well as each combination of features, particularly each combination of features of the appended claims, even if the feature or combination of features itself is not explicitly given in the claims or examples.

The invention claimed is:

1. A method of manufacturing a radiation emitting semiconductor device comprising:
    providing a radiation emitting semiconductor chip having a first main surface comprising a radiation exit surface of the semiconductor chip,
    applying a metallic seed layer to a second main surface of the semiconductor chip opposite the first main surface,
    galvanically depositing a metallic volume region of a first electrical contact point and a metallic volume region of a second electrical contact point on the seed layer,
    depositing an adhesion promoting layer on the volume regions of the first electrical contact point and the second electrical contact point, and
    applying a casting compound at least between the contact points, wherein
    before the metallic volume regions are galvanically deposited, a dielectric layer is first applied to the seed layer over its entire surface and openings are produced in the dielectric layer by etching,
    a material of the metallic volume regions is deposited through the openings of the dielectric layer, wherein the dielectric layer is underetched at boundaries to the openings and the underetches are filled with material of the metallic volume regions during the galvanical depositing of the metallic volume regions, and
    the adhesion promoting layer is applied to the volume regions such that it completely covers each of the surfaces of the volume reasons,
    the casting compound is applied such that the casting compound completely envelops the electrical contact points, and
    first main surfaces of the electrical contact points are exposed by removing the casting compound, wherein the adhesion promoting layer is removed from the first main surfaces.

2. The method according to claim 1, wherein
    structural elements of a photoresist are applied to the dielectric layer over the entire surface, and
    the openings in the dielectric layer are produced by etching the regions, which are freely accessible.

3. The method according to claim 2, wherein the metallic volume regions are deposited between the structural elements of the photoresist.

4. The method according to claim 1, wherein the volume regions comprise one of nickel, copper, tin, and gold.

5. The method according to claim 1, wherein the adhesion promoting layer comprises one of SiN, $SiO_x$, Ti, $TiO_2$, Sn, and fluorine-containing compounds.

6. The method according to claim 1, wherein the adhesion promoting layer is applied by one of galvanical deposition, PVD, CVD, electroless galvanic deposition, sputtering, spinning, dipping, and spraying.

7. The method according to claim 1, wherein the adhesion promoting layer has a thickness of 0.5 nanometers to 5 micrometers.

8. The method according to claim 1, wherein the seed layer comprises one of Au, Ti, Cu, Al, Ag, Sn, Rh, and Pt.

9. The method according to claim 1, wherein the seed layer is applied by one of electroless galvanic deposition, vapor deposition, PECVD, and sputtering.

10. A radiation emitting semiconductor device comprising:
    a radiation emitting semiconductor chip having a first main surface comprising a radiation exit surface of the semiconductor chip,
    a seed layer on a second main surface of the semiconductor chip opposite the first main surface, and
    a first electrical contact point and a second electrical contact point arranged at the second main surface of the semiconductor chip, wherein
    each contact point has a metallic volume region and an adhesion promoting layer, the adhesion promoting layer forming at least partially an outer surface of the contact point and effecting adhesion promotion to a casting compound that laterally completely envelops the contact points,
    a second main surface of each contact point facing the semiconductor chip has a larger area than a first main surface of each contact point opposite the second main surface,
    the metallic volume region of the contact points is galvanically deposited on the seed layer, wherein side faces of the contact points are completely covered with the adhesion promoting layer and the first main surface of the contact points is free of the adhesion promoting layer, and the contact points and the casting compound are flush with each other.

11. The radiation emitting semiconductor device according to claim 10, wherein the adhesion promoting layer completely covers side surfaces of the volume regions of the contact points, while a main surface of the volume regions is free of the adhesion promoting layer.

12. The radiation emitting semiconductor device according to claim 11, wherein a solderable layer forming a mounting surface of the contact points is applied to the main surface of the volume regions, which is free of the adhesion promoting layer.

13. The radiation emitting semiconductor device according to claim 10, wherein the adhesion promoting layer comprises tin or is formed of tin.

\* \* \* \* \*